(12) United States Patent
Okabe et al.

(10) Patent No.: US 7,707,715 B2
(45) Date of Patent: May 4, 2010

(54) METHOD OF FABRICATING MULTILAYER PRINTED CIRCUIT BOARD

(75) Inventors: Shuhichi Okabe, Gyunggi-do (KR); Je Gwang Yoo, Gyunggi-do (KR); Chang Sup Ryu, Gyunggi-do (KR); Myung Sam Kang, Daejeon (KR); Jung Hyun Park, Gyunggi-do (KR); Ji Hong Jo, Chungcheongnam-do (KR); Jin Yong An, Daejeon (KR); Soon Oh Jung, Gyunggi-do (KR)

(73) Assignee: Samsung Electro-Mechanics, Co., Ltd., Suwon (KR)

( * ) Notice: Subject to any disclaimer, the term of this patent is extended or adjusted under 35 U.S.C. 154(b) by 185 days.

(21) Appl. No.: 12/005,610

(22) Filed: Dec. 28, 2007

(65) Prior Publication Data

US 2009/0056119 A1 Mar. 5, 2009

(30) Foreign Application Priority Data

Aug. 31, 2007 (KR) ............. 10-2007-0088346
Aug. 31, 2007 (KR) ............. 10-2007-0088347

(51) Int. Cl.
*H05K 3/00* (2006.01)
(52) U.S. Cl. ............... 29/846; 29/830; 29/831; 29/847; 29/852; 174/262; 174/250; 174/748; 361/760; 361/783; 361/264

(58) Field of Classification Search ............ 29/830, 29/846, 847, 832, 831, 852; 174/262, 250, 174/748; 361/760, 783, 264
See application file for complete search history.

(56) References Cited

U.S. PATENT DOCUMENTS

| 5,939,789 A | * | 8/1999 | Kawai et al. | 257/758 |
| 6,691,409 B2 | * | 2/2004 | Suzuki et al. | 29/852 |
| 6,808,642 B2 | * | 10/2004 | Takaya et al. | 216/13 |

FOREIGN PATENT DOCUMENTS

| JP | 2005019883 A | * | 1/2005 |
| JP | 2005-39233 | | 2/2005 |
| JP | 2005039233 A | * | 2/2005 |

OTHER PUBLICATIONS

English Abstract of Korean Patent Publication No. 10-2006-0062896 published on Jun. 12, 2006.
English Abstract of Korean Patent Registration No. 10-0274764, Registration Date: Sep. 15, 2000.
Office Action mailed on Sep. 26, 2008 and issued in corresponding Korean Patent Application No. 10-2007-0088346.

* cited by examiner

*Primary Examiner*—Derris H Banks
*Assistant Examiner*—Dan D Le

(57) ABSTRACT

Disclosed is a method of fabricating a multilayer printed circuit board, which enables the formation of a micro circuit able to be realized through a semi-additive process using the CTE and rigidity of a metal carrier on a thin substrate which is difficult to convey.

21 Claims, 11 Drawing Sheets

METHOD OF FABRICATING MULTILAYER PRINTED CIRCUIT BOARD

CROSS-REFERENCE TO RELATED APPLICATIONS

This application claims the benefit of Korean Patent Application Nos. 10-2007-0088346, filed on Aug. 31, 2007, and 10-2007-0088347, filed on Aug. 31, 2007, entitled "Fabricating method of multi layer printed circuit board", which are hereby incorporated by reference in their entirety into this application.

BACKGROUND OF THE INVENTION

1. Field of the Invention

The present invention relates, in general, to a method of fabricating a multilayer printed circuit board, and particularly, to a method of fabricating a multilayer printed circuit board, in which a circuit pattern can be formed in an insulating layer to thus decrease the thickness of a printed circuit board and realize a micro circuit, and a printed circuit board can be stably fabricated regardless of changes in temperature or humidity in the process of fabricating a printed circuit board.

2. Description of the Related Art

Generally, a printed circuit board (PCB), which is a circuit substrate playing a role in electrically connecting or mechanically holding predetermined electronic components, is composed of an insulating layer, made of phenol resin or epoxy resin, and a copper foil layer having a predetermined wiring pattern attached to the insulating layer.

The PCB is largely classified into, depending on the number of layers, single-sided PCBs, in which a wiring pattern is formed on only one surface of an insulating layer, double-sided PCBs, in which a wiring pattern is formed on both surfaces of an insulating layer, and multilayer PCBs, in which a wiring pattern is formed into a plurality of layers.

Among the types of PCB, the multilayer PCB is fabricated by impregnating a woven glass cloth with BT, FR-4, or another resin to thus prepare a core, laminating copper foils on both surfaces of the core to form inner circuits, and then conducting a subtractive process or a semi-additive process.

The method of fabricating the multilayer PCB using a subtractive process or a semi-additive process is described below.

In the method of fabricating the PCB according to a conventional technique, first, a copper clad laminate (CCL), in which copper foils are laminated on both surfaces of a first insulating layer, is prepared, and then a dry film is applied on the copper foils.

Next, the portion of the dry film other than the portion of the dry film corresponding to a circuit pattern is removed through exposure and development, after which the copper foil is etched using an etchant, thus forming an inner circuit pattern.

After the formation of the inner circuit pattern, the dry film, applied on the inner circuit pattern, is removed.

Next, a second insulating layer is formed on the inner circuit pattern, and then a via hole is formed through drilling.

After the formation of the via hole, a copper plating layer is formed on the inner wall of the via hole and the second insulating layer through electroless copper plating and copper electroplating, and then a dry film is applied on the copper plating layer.

Next, the portion of the dry film other than the portion of the dry film corresponding to an outer circuit pattern is removed through exposure and development, and then the copper plating layer is etched using an etchant, thus forming an outer circuit pattern.

After the formation of the outer circuit pattern, a third insulating layer is formed on the outer circuit pattern, and then a blind via hole is formed using a laser drill to expose the portion of the outer circuit pattern.

Next, a copper plating layer is formed on the inner wall of the blind via hole and the third insulating layer through electroless copper plating and copper electroplating, a dry film is applied on the copper plating layer, and then the portion of the dry film other than the portion of the dry film corresponding to an outermost circuit pattern is removed through exposure and development.

Next, the copper foil, exposed by removing the portion of the dry film, is etched using an etchant, thus forming an outermost circuit pattern.

SUMMARY OF THE INVENTION

However, the method of fabricating the PCB according to the prior art is disadvantageous because an inner circuit pattern is formed on an insulating layer, thus increasing the thickness of the PCB.

Further, the method of fabricating the PCB according to the prior art is disadvantageous because a copper plating layer must be etched using an etchant to thus form a circuit pattern, and thus the upper portion of the circuit pattern is over-etched, or the lower portion of the circuit pattern is not etched, so that it is difficult to realize the width between desired circuit patterns, that is, the pitch, resulting in an unrealized micro circuit.

Furthermore, the method of fabricating the PCB according to the prior art is disadvantageous because the multilayer PCB is realized using a CCL, and thus deformation of the PCB, including extension or warping, is caused by heat or humidity occurring upon the fabrication of the PCB, making it impossible to stably fabricate the PCB.

Therefore, the present invention provides a method of fabricating a multilayer PCB, which is capable of being used to form a fine micro circuit, which can be realized through a semi-additive process using the CTE (Coefficient of Thermal Expansion) and rigidity of a metal carrier, on a thin substrate, which is difficult to convey.

In addition, the present invention provides a method of fabricating a multilayer PCB, which is capable of forming a circuit pattern within an insulating layer to thus decrease the thickness of the PCB and realize a micro circuit.

In addition, the present invention provides a method of fabricating a multilayer PCB, which is capable of stably fabricating the PCB regardless of changes in temperature or humidity in the PCB fabrication process.

According to a first embodiment of the present invention, a multilayer PCB may include a) forming a first metal plating layer on a first metal carrier, and then forming a first circuit pattern on the first metal plating layer, thus preparing a first substrate; b) forming a second metal plating layer on a second metal carrier, and then forming a second circuit pattern on the second metal plating layer, thus preparing a second substrate; c) interposing a first insulating material between the first circuit pattern of the first substrate and the second circuit pattern of the second substrate, laminating the first substrate, the first insulating material and the second substrate, and then removing the second metal carrier and the second metal plating layer from the second substrate; d) forming a via hole to expose an upper surface of the first circuit pattern; e) forming an electroless copper plating layer on an inner wall of the via hole, the first circuit pattern, and the second circuit pattern, and then filling the via hole; f) applying a photosensitive material on the electroless copper plating layer, and then removing a portion of the photosensitive material corresponding to a connection plating layer; g) sequentially forming a copper electroplating layer and a connection plating layer on the electroless copper plating exposed by removing the portion of the photosensitive material, and then removing the electroless plating layer; h) interposing a second insulating material between a connection plating layer of a third substrate formed through the a) to the g) and a second circuit pattern of a fourth substrate formed through the a) to the e), and then laminating the third substrate, the second insulating material and the fourth substrate, thus connecting the connection plating layer of the third substrate to the second circuit pattern of the fourth substrate; and i) sequentially removing the first metal carrier and the first metal plating layer from the third substrate and the fourth substrate.

In the method of fabricating a multilayer PCB according to the first embodiment of the present invention, each of the a) and the b) may include forming a metal plating layer on a metal carrier; applying a photosensitive material on the metal plating layer; removing a portion of the photosensitive material corresponding to either the first circuit pattern or the second circuit pattern through exposure and development; and forming either the first circuit pattern or the second circuit pattern through copper electroplating on the metal plating layer exposed by removing the portion of the photosensitive material.

In the method of fabricating a multilayer PCB according to the first embodiment of the present invention, the metal carrier may be any one selected from among SUS304, Invar, and Kovar, having a low coefficient of thermal expansion.

In the method of fabricating a multilayer PCB according to the first embodiment of the present invention, the metal plating layer may be a plating layer which is able to be subsequently removed through flash etching.

In the method of fabricating a multilayer PCB according to the first embodiment of the present invention, the metal plating layer may be a copper foil.

In the method of fabricating a multilayer PCB according to the first embodiment of the present invention, the photosensitive material may be a photoresist or a solder resist.

In the method of fabricating a multilayer PCB according to the first embodiment of the present invention, in the c) and the i), the metal plating layer may be removed using an etchant after the metal carrier may be removed.

In the method of fabricating a multilayer PCB according to the first embodiment of the present invention, the connection plating layer may include any one metal selected from among Ag, Sn, and Pb.

The method of fabricating a multilayer PCB according to the first embodiment of the present invention may include preparing a fifth substrate having four layers through the a) to the i), preparing a fourth substrate having two layers through the a) to the e), forming a copper electroplating layer and a connection plating layer on a portion of a second circuit pattern of the fourth substrate, interposing an insulating material between a first circuit pattern of the fifth substrate and the connection plating layer of the fourth substrate, laminating the fourth substrate, the insulating material and the fifth substrate, and then removing a first metal carrier and a first metal plating layer from the fourth substrate and the fifth substrate, thereby fabricating a multilayer PCB having six layers.

The method of fabricating a multilayer PCB according to the first embodiment of the present invention may include preparing a fifth substrate having four layers through the a) to the i), preparing a sixth substrate having four layers through the a) to the i), forming a copper electroplating layer and a connection plating layer on a portion of a first circuit pattern of the fifth substrate, interposing an insulating material between the first circuit pattern of the fifth substrate and a connection plating layer of the sixth substrate, laminating the fifth substrate, the insulating material, and the sixth substrate, and then removing a first metal carrier and a first metal plating layer from the fifth substrate and the sixth substrate, thereby fabricating a multilayer PCB having eight layers.

According to a second embodiment of the present invention, a method of fabricating a multilayer PCB may include a) forming a first metal plating layer on a first metal carrier, and then forming a first circuit pattern on the first metal plating layer, thus preparing a first substrate; b) forming a second metal plating layer on a second metal carrier, and then forming a second circuit pattern on the second metal plating layer, thus preparing a second substrate; c) interposing a first insulating material between the first circuit pattern of the first substrate and the second circuit pattern of the second substrate, and then laminating the first substrate, the first insulating material, and the second substrate; d) removing the second metal carrier and the second metal plating layer from the second substrate, and then forming a via hole to expose an upper surface of the first circuit pattern; e) forming an electroless copper plating layer on an inner wall of the via hole, the first circuit pattern, and the second circuit pattern, and then filling the via hole; f) applying a photosensitive material on a portion of the electroless copper plating layer other than a portion of the electroless copper plating layer corresponding to a connection plating layer, and then forming the connection plating layer on the electroless copper plating layer; g) removing the electroless copper plating layer, which is formed on the second circuit pattern and the first insulating material, using an etchant and using the connection plating layer as a mask, and then etching the electroless copper plating layer having no connection plating layer thereon so that the electroless copper plating layer is lower than a surface of the first insulating material; h) interposing a second insulating material between a connection plating layer of a third substrate formed through the a) to the g) and a second circuit pattern of a fourth substrate formed through the a) to the e) and then through etching so that a portion of the electroless copper plating layer, other than a portion of the electroless copper plating layer which is to be connected to the connection plating layer, is etched to be lower than the surface of the first insulating material using a photoresist as a mask instead of the connection plating layer in the g), and then laminating the third substrate, the second insulating material, and the fourth substrate, thus connecting the connection plating layer of the third substrate to the second circuit pattern of the fourth substrate; and i) sequentially removing a first metal carrier and a first metal plating layer from the third substrate and the fourth substrate.

In the method of fabricating a multilayer PCB according to the second embodiment of the present invention, each of the a) and the b) may include forming a metal plating layer on a metal carrier; applying a photosensitive material on the metal plating layer; removing a portion of the photosensitive material corresponding to either the first circuit pattern or the second circuit pattern through exposure and development; and forming either the first circuit pattern or the second circuit pattern through copper electroplating on the metal plating layer exposed by removing the portion of the photosensitive material.

In the method of fabricating a multilayer PCB according to the second embodiment of the present invention, the metal carrier may be any one selected from among SUS304, Invar, and Kovar, having a low coefficient of thermal expansion.

In the method of fabricating a multilayer PCB according to the second embodiment of the present invention, the metal plating layer may be a plating layer which is able to be subsequently removed through flash etching.

In the method of fabricating a multilayer PCB according to the second embodiment of the present invention, the metal plating layer may be formed of a conductive material.

In the method of fabricating a multilayer PCB according to the second embodiment of the present invention, the photosensitive material may be a photoresist or a solder resist.

In the method of fabricating a multilayer PCB according to the second embodiment of the present invention, in the d) and the i), the metal plating layer may be removed using an etchant after the metal carrier may be removed.

In the method of fabricating a multilayer PCB according to the second embodiment of the present invention, the connection plating layer may include any one selected from among Ag, Sn, and Pb as a metal for terminal connection.

In the method of fabricating a multilayer PCB according to the second embodiment of the present invention, when the third substrate and the fourth substrate, formed by etching the electroless copper plating layer having no connection plating layer thereon and the electroless copper plating layer having no photoresist thereon so that the electroless copper plating layer is lower than the surface of the first insulating material using the connection plating layer and the photoresist as a mask in the g) or the h), are laminated, a space defined by etched portions of the third substrate and the fourth substrate is filled with the second insulating material to thus form an insulating layer between the third substrate and the fourth substrate.

The method of fabricating a multilayer PCB according to the second embodiment of the present invention may include preparing a fifth substrate having four layers through the a) to the i), subjecting the fifth substrate to etching so that a portion of a circuit pattern of the fifth substrate other than a portion of the circuit pattern which is to be connected to the connection plating layer is etched to be lower than the surface of the first insulating material using a photoresist instead of the connection plating layer as a mask, preparing a third substrate having two layers through the a) to the g), interposing a third insulating material between the fifth substrate and the third substrate, laminating the third substrate, the third insulating material and the fifth substrate to thus connect the connection plating layer of the third substrate to the circuit pattern of the fifth substrate, and then sequentially removing a first metal carrier and a first metal plating layer from the third substrate, thereby fabricating a multilayer PCB having six layers.

The method of fabricating a multilayer PCB according to the second embodiment of the present invention may include sequentially subjecting two fifth substrates, each having four layers, to the h) and the i), thereby fabricating a multilayer PCB having eight layers, or sequentially subjecting a sixth substrate having six layers and a fifth substrate having four layers to the h) and the i), thereby a multilayer PCB having ten layers.

DETAILED DESCRIPTION OF THE PREFERRED EMBODIMENTS

Hereinafter, a detailed description will be given of the preferred embodiments of the present invention, with reference to the appended drawings.

Figure 1A:
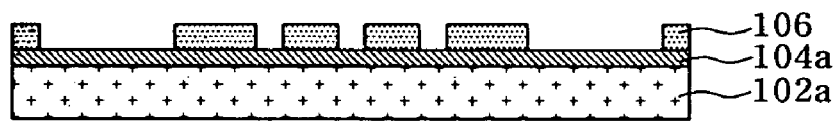
FIGS. 1A to 1U are sectional views sequentially illustrating the process of fabricating a multilayer PCB, according to a first embodiment of the present invention.
Figure 1B:
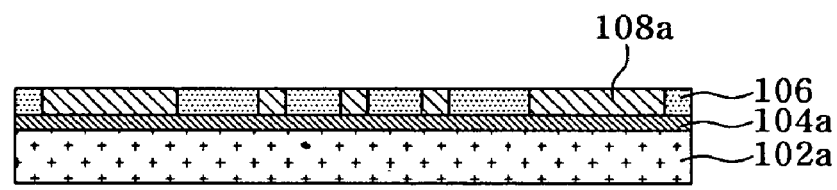
Figure 1C:
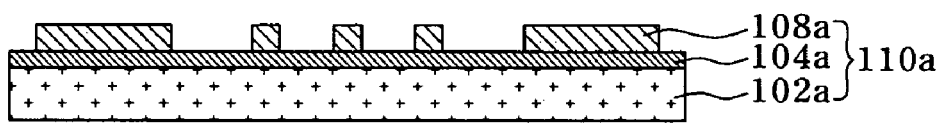
Figure 1D:
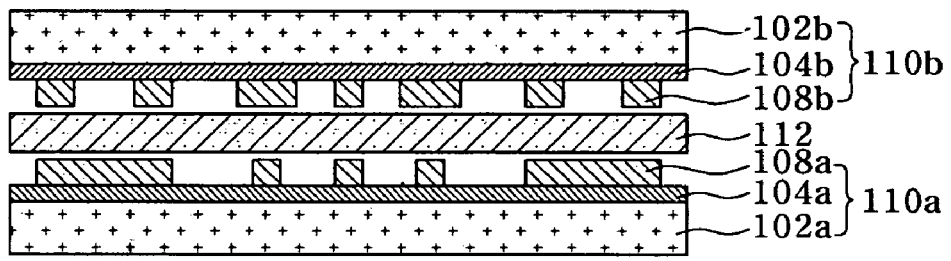
Figure 1E:
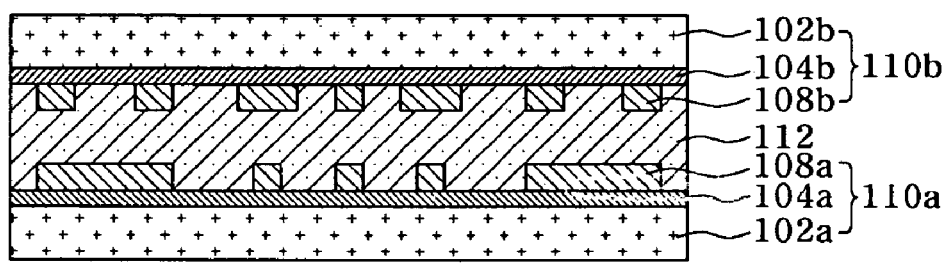
Figure 1F:
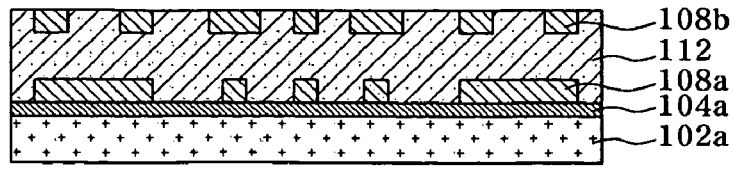
Figure 1G:
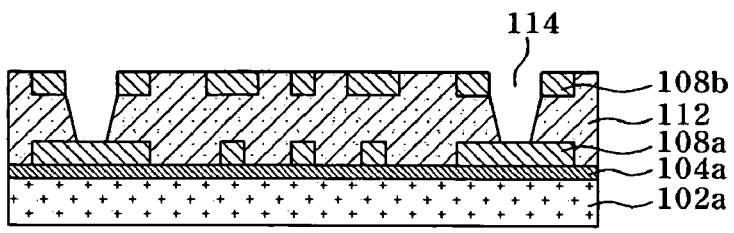
Figure 1H:
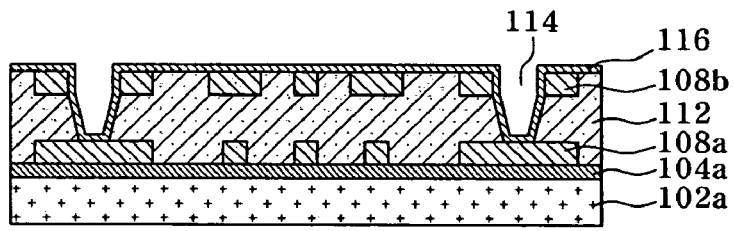
Figure 1I:
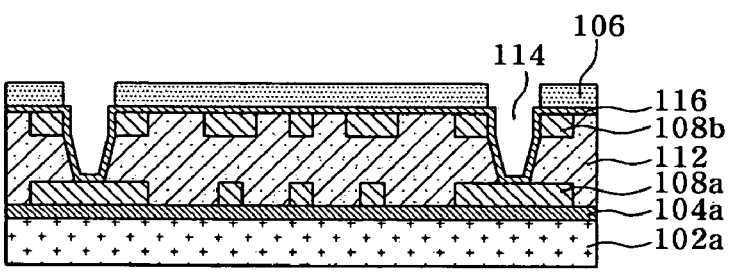
Figure 1J:
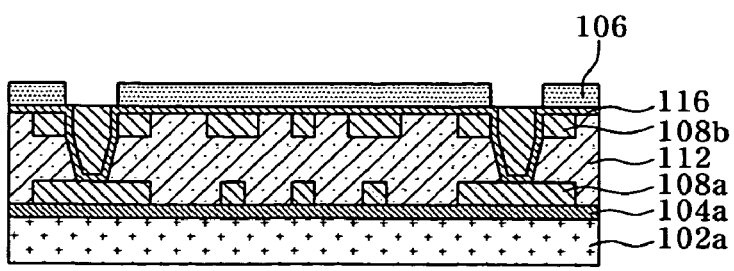
Figure 1K:
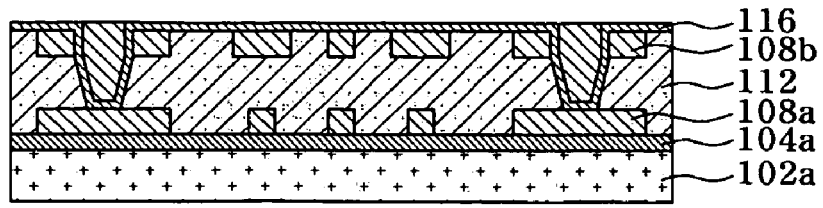
Figure 1L:
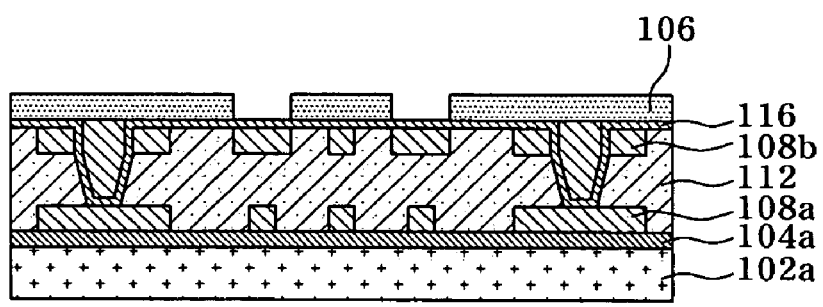
Figure 1M:
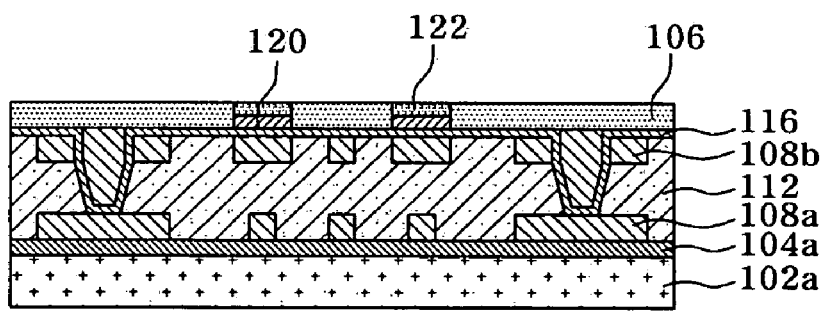
Figure 1N:
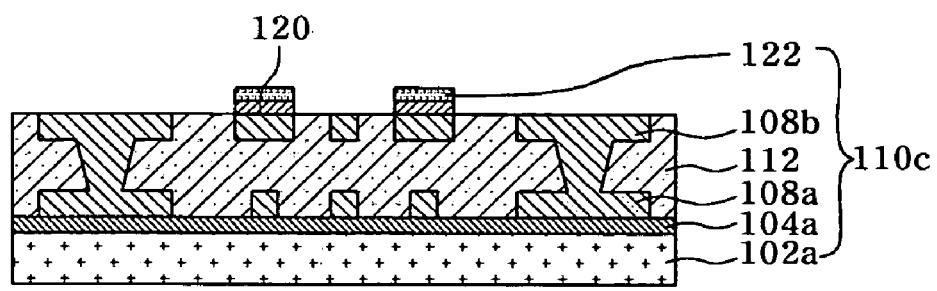
Figure 1O:
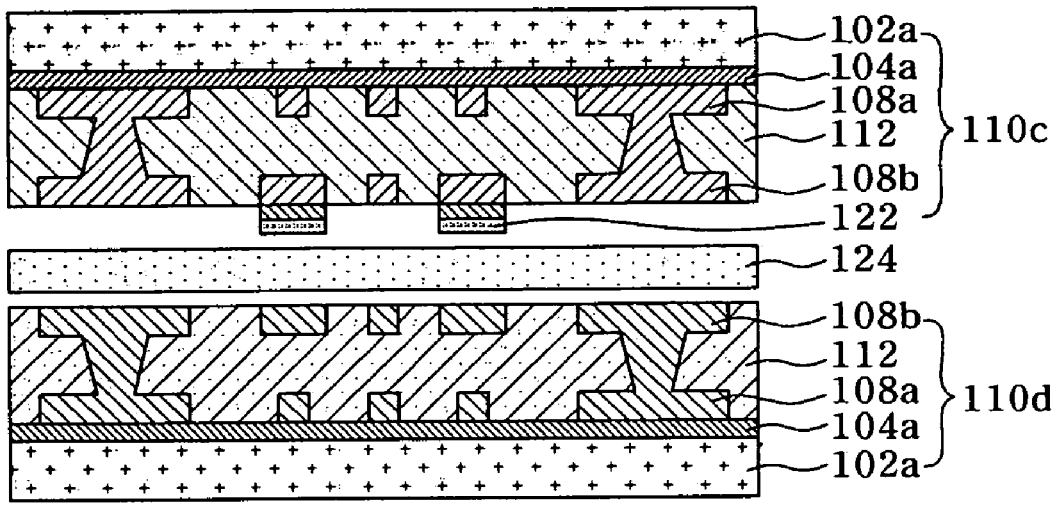
Figure 1P:
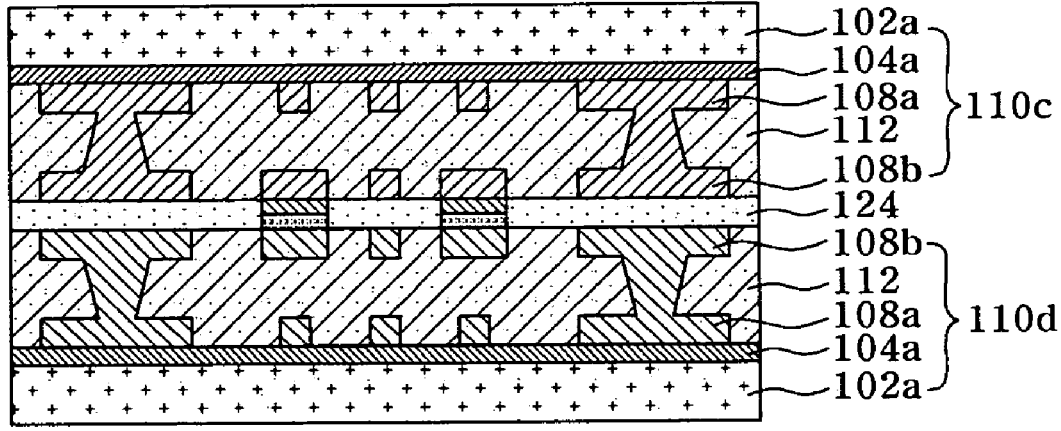
Figure 1Q:
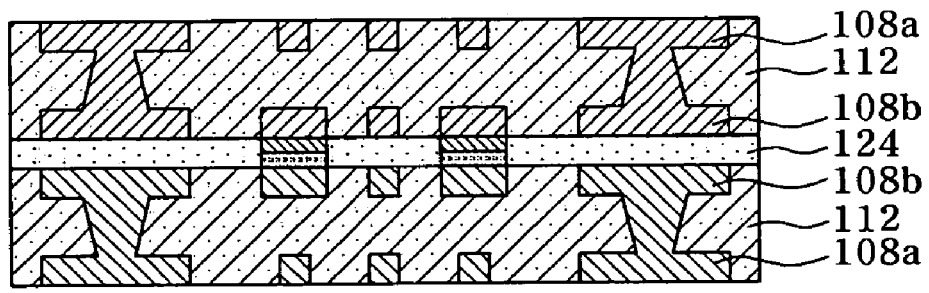
Figure 1R:
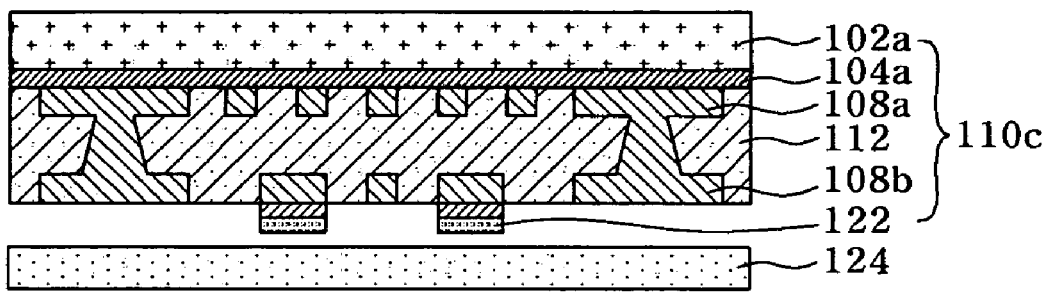
Figure 1R:
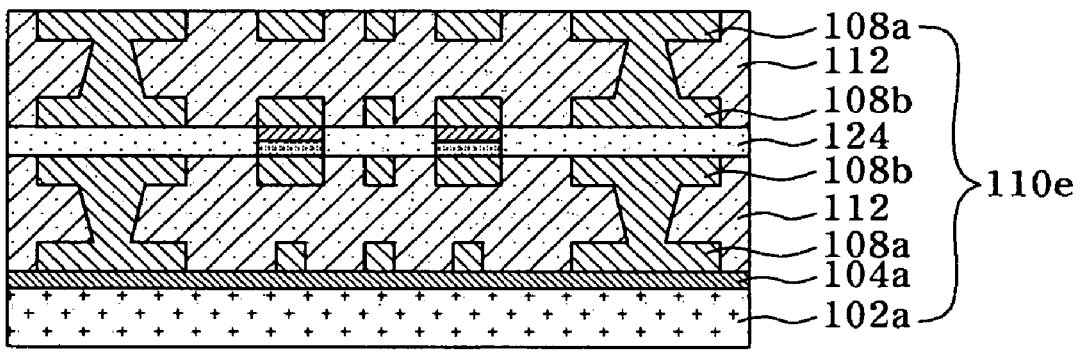
Figure 1S:
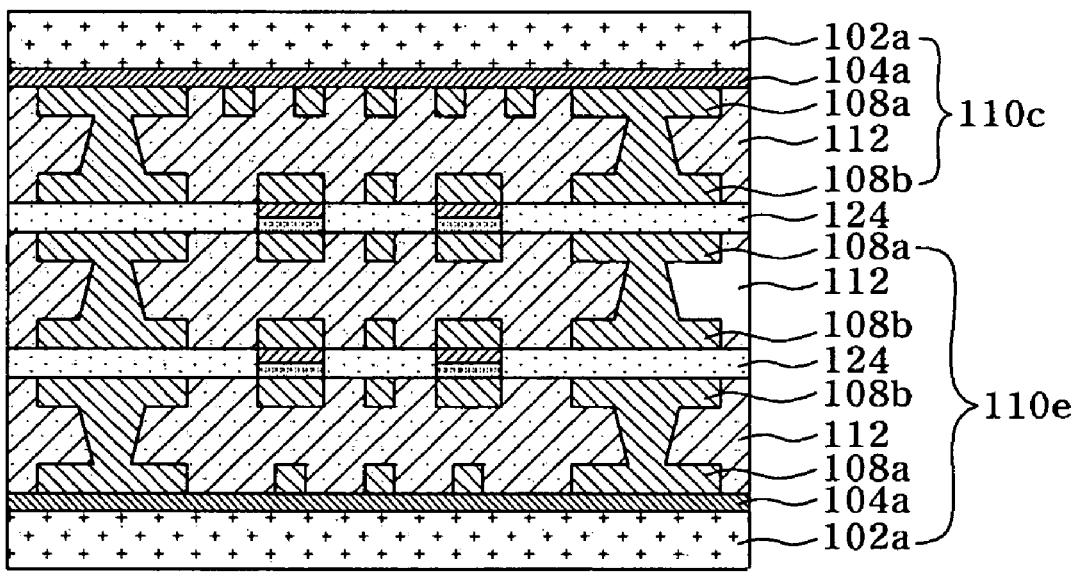
Figure 1T:
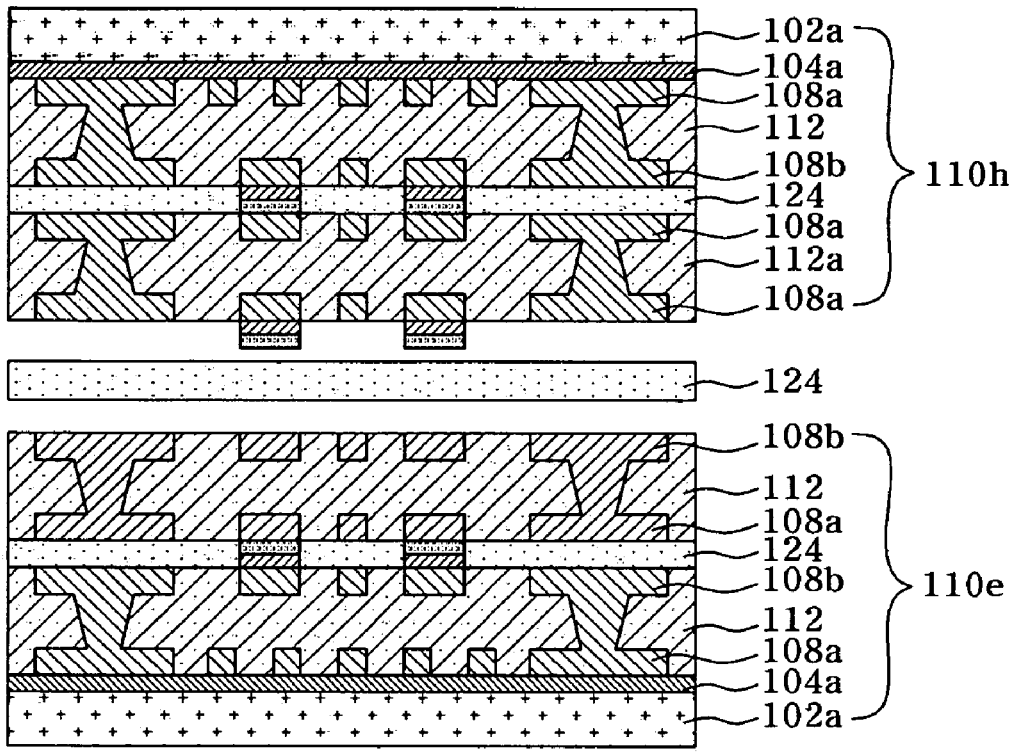
Figure 1U:
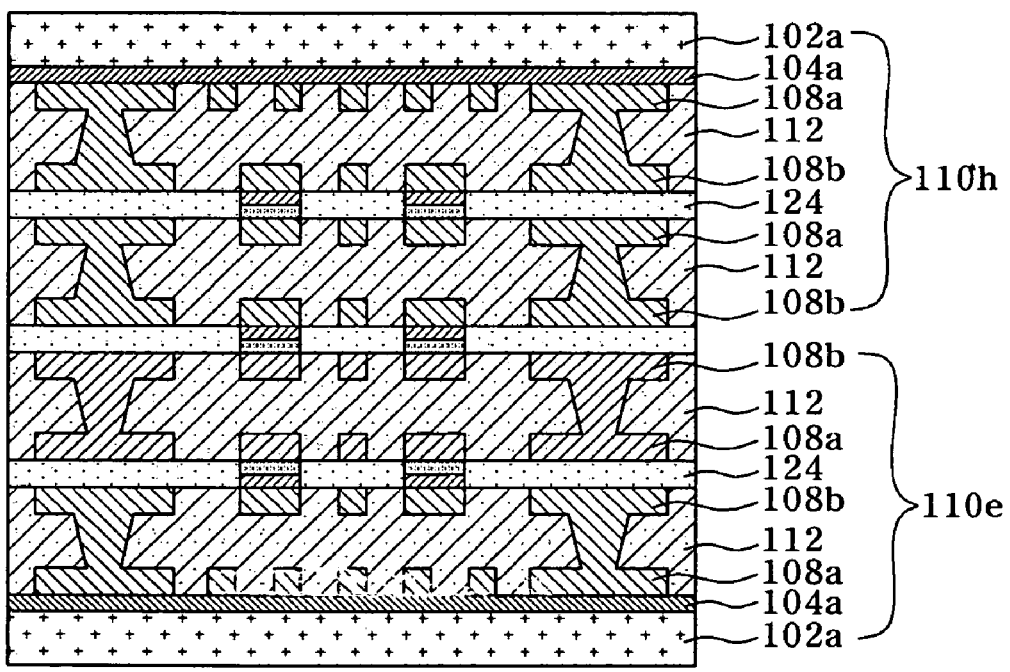

FIGS. 1A to 1U are sectional views sequentially illustrating the process of fabricating a multilayer PCB, according to a first embodiment of the present invention.

As shown in FIG. 1A, a first metal plating layer 104a is formed on a first metal carrier 102a having a very low CTE.

For the first metal carrier 102a, useful is a metal having a low CTE, for example, SUS304, Invar, or Kovar, in order to protect the substrate from deformation, including extension or warping, due to changes in atmospheric temperature or differences in process temperatures.

As the first metal plating layer 104a, a plating layer which is able to be removed through flash etching in a subsequent procedure, like an electroless copper plating layer formed through electroless plating, is formed on the first metal carrier 102a.

Alternatively, the first metal plating layer 104a may be formed by laminating a conductive material, such as a copper foil, on the first metal carrier 102a.

After the formation of the first metal plating layer 104a on the first metal carrier 102a, a photosensitive material 106 is applied on the first metal plating layer 104a.

As the photosensitive material 106, useful is either a liquid photosensitive material, such as a photoresist, or a solder resist. For the formation of a micro circuit pattern, the use of a photoresist is preferable.

After the application of the photosensitive material 106 on the first metal plating layer 104a, an artwork film having a circuit pattern is attached to the substrate on which the photosensitive material 106 is applied, and is then irradiated with UV light.

Accordingly, the portion of the photosensitive material 106, other than the portion of the photosensitive material 106 corresponding to a circuit pattern, is irradiated with UV light and is thus cured.

That is, the portion of the photosensitive material 106, other than the portion of the photosensitive material 106 corresponding to a circuit pattern, is cured through exposure.

Next, the uncured photosensitive material 106, that is, the portion of the photosensitive material 106 corresponding to a circuit pattern, is removed using a developing agent.

As such, the developing agent is exemplified by sodium carbonate (1% $Na_2CO_3$) or potassium carbonate ($K_2CO_3$).

Next, as shown in FIG. 1B, a first circuit pattern 108a, which is a lower circuit, is formed through copper electroplating.

After the formation of the first circuit pattern 108a, as shown in FIG. 1C, the photosensitive material 106 is removed. Accordingly, only the first circuit pattern 108a, which is a lower circuit, remains on the first metal plating layer 104a.

After the formation of a first substrate composed of the first metal carrier 102a, the first metal plating layer 104a, and the first circuit pattern 108a, a second substrate is prepared by forming a second metal plating layer on a second metal carrier and then forming a second circuit pattern, which is an upper circuit, on the second metal plating layer, through the same process as that shown in FIGS. 1A to 1C.

After the formation of the second substrate, as shown in FIG. 1D, a first insulating material 112 is interposed between the second circuit pattern 108b of the second substrate 110b and the first circuit pattern 108a of the first substrate 110a, and then, as shown in FIG. 1E, the first substrate 110a, the first insulating material 112 and the second substrate 110b, in that order, are laminated by heat and pressure using a press.

As such, the first insulating material 112 is exemplified by a prepreg.

Next, as shown in FIG. 1F, the second metal carrier 102b and the second metal plating layer 104b are removed from the second substrate 110b.

The second metal plating layer 104b is removed through etching using an etchant.

After the removal of the second metal carrier 102b and the second metal plating layer 104b from the second substrate 110b, as shown in FIG. 1G, via holes 114 for inner layer connection are formed to expose the upper surface of the first circuit pattern 108a using a laser.

After the formation of the via holes, as shown in FIG. 1H, an electroless copper plating layer 116 is formed through electroless copper plating.

The electroless copper plating layer 116 is formed on the second circuit pattern 108b, the inner walls of the via holes 114, and the exposed first circuit pattern 108a.

After the formation of the electroless copper plating layer 116, as shown in FIG. 1I, a photosensitive material 106 is applied on the electroless copper plating layer 116.

As the photosensitive material 106, either a liquid photosensitive material, such as a photoresist, or a solder resist is used. For the formation of a micro circuit pattern, a photoresist is preferably used.

After the application of the photosensitive material 106 on the electroless copper plating layer 116, an artwork film having a connection via hole is attached to the substrate on which the photosensitive material 106 is applied, and is then irradiated with UV light.

Accordingly, the portion of the photosensitive material 106, other than the portion of the photosensitive material 106 corresponding to a connection via hole, is irradiated with UV light and is thus cured.

That is, the portion of the photosensitive material 106, other than the portion of the photosensitive material 106 corresponding to a connection via hole, is cured through exposure.

Next, the uncured photosensitive material 106, that is, the portion of the photosensitive material 106 corresponding to a connection via hole, is removed using a developing agent.

This developing agent is exemplified by sodium carbonate (1% $Na_2CO_3$) or potassium carbonate ($K_2CO_3$).

Next, as shown in FIG. 1J, the via holes 114 are filled through fill plating using copper electroplating.

After the filling of the via holes 114, as shown in FIG. 1K, the photosensitive material 106 is removed, and then, as shown in FIG. 1L, a photosensitive material 106 is applied on the second circuit pattern 108b of the PCB having the via holes 114 which are filled.

As the photosensitive material 106, either a liquid photosensitive material, such as a photoresist, or a solder resist is used. For the formation of a micro circuit pattern, a photoresist is preferably used.

After the application of the photosensitive material 106, the portion of the photosensitive material 106 corresponding to a connection plating layer is removed through exposure and development.

Next, as shown in FIG. 1M, a copper electroplating layer 120 is formed on the electroless copper plating layer 116 exposed by the portion of the photosensitive material corresponding to a connection plating layer, and then a connection plating layer 122 is formed on the copper electroplating layer 120 using a metal such as Ag, Sn, or Pb.

After the formation of the connection plating layer 122, as shown in FIG. 1N, the photosensitive material 106 is removed, and then the electroless copper plating layer 116, formed on the second circuit pattern 108b, is removed using an etchant.

As such, because the electroless copper plating layer 116 formed on the inner walls of the via holes and the second circuit pattern 108b, the second circuit pattern 108b, and the fill plating loaded in the via holes are formed of a conductive material, they are integrated into the second circuit pattern 108b and are thus simply shown.

The connection plating layer 122 functions as a mask for preventing the copper electroplating layer 120 and the electroless copper plating layer 116 formed therebeneath from being etched by an etchant.

In this way, the third substrate having the connection plating layer 122 is formed, after which, as shown in FIG. 1O, a second insulating material 124 is interposed between the second circuit pattern 108b of a fourth substrate 110d and the connection plating layer 122 of the third substrate 110c, and then, as shown in FIG. 1P, the third substrate, the second insulating material, and the fourth substrate are laminated by heat and pressure using a press.

Accordingly, the connection plating layer 122 of the third substrate 110c is connected to the second circuit pattern 108b of the fourth substrate 110d.

The fourth substrate 110d is prepared by filling via holes 114 and removing an electroless copper plating layer 116 formed on the second circuit pattern 108b through flash etching, according to the PCB fabrication process shown in FIGS. 1A to 1K.

In the case of using a process other than the process shown in FIGS. 1L and 1M for forming the connection plating layer 122, the fourth substrate 110d may be formed.

As the second insulating material 124, a prepreg or polyimide may be used.

Next, as shown in FIG. 1Q, the metal carriers 102a, 102b and the metal plating layers 104a, 104b are removed. The metal plating layers 104a, 104b are removed through flash etching using an etchant following the removal of the metal carriers 102a, 102b.

As mentioned above, through the method of fabricating the multilayer PCB according to the first embodiment of the present invention, the multilayer PCB having four layers is fabricated. However, in the case where it is desired to fabricate a PCB having four or more layers, for example, six or eight layers, the process shown in FIG. 1R and 1S or the process shown in FIGS. 1T and 1U, after the process shown in FIG. 1P, may be conducted, thereby fabricating a PCB having six or eight layers.

Because the method of fabricating the multilayer PCB shown in FIGS. 1R to 1U is a repetition of the method of fabricating the multilayer PCB shown in FIGS. 1A to 1Q, a detailed description thereof is to be replaced with the above description.

In the method of fabricating the multilayer PCB according to the first embodiment of the present invention, because the circuit pattern is inserted into the insulating layer, the thickness of the PCB can be decreased, and also, because the photosensitive material is applied on the portion of the metal plating layer other than the portion of the metal plating layer corresponding to the circuit pattern and subsequently the circuit pattern is formed through copper electroplating, a micro circuit can be realized.

Further, in the method of fabricating the multilayer PCB according to the first embodiment of the present invention, because a metal carrier having a low CTE, such as SUS304, Invar, or Kovar, is used in order to protect the substrate from deformation, including extension or warping, due to the change in atmospheric temperature or the difference in process temperatures, the PCB can be stably fabricated regardless of the changes in temperature or humidity.

Furthermore, in the method of fabricating the multilayer PCB according to the first embodiment of the present invention, because the PCB is fabricated by embedding the multilayer circuit pattern in the insulating layer and then removing the metal carrier and the metal plating layer, a high-density PCB having a flat surface can be fabricated.

Figure 2A:
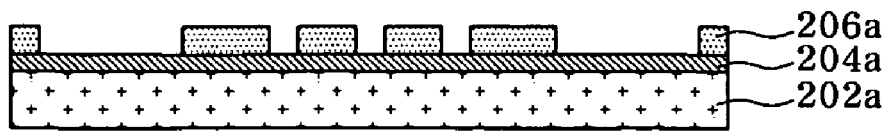
FIGS. 2A to 2T are sectional views sequentially illustrating the process of fabricating a multilayer PCB, according to a second embodiment of the present invention.
Figure 2B:
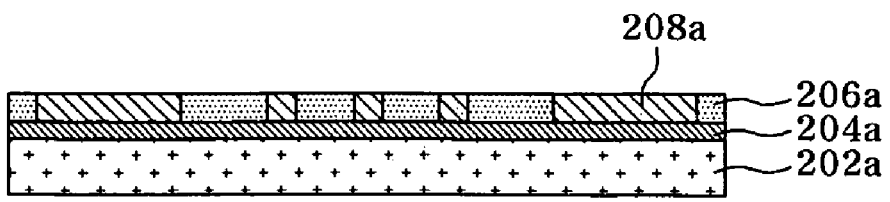
Figure 2C:
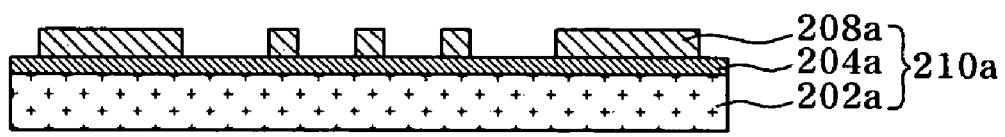
Figure 2D:
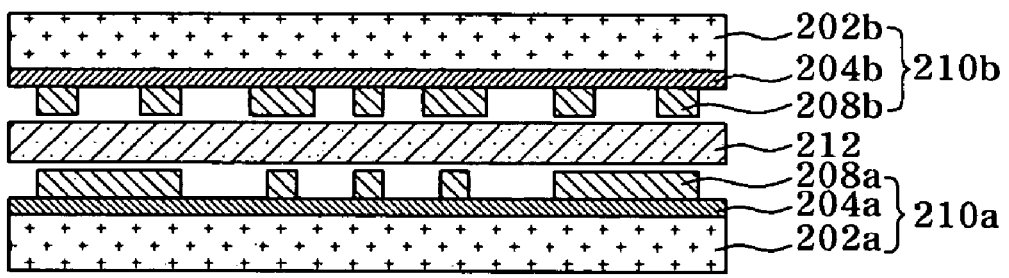
Figure 2E:
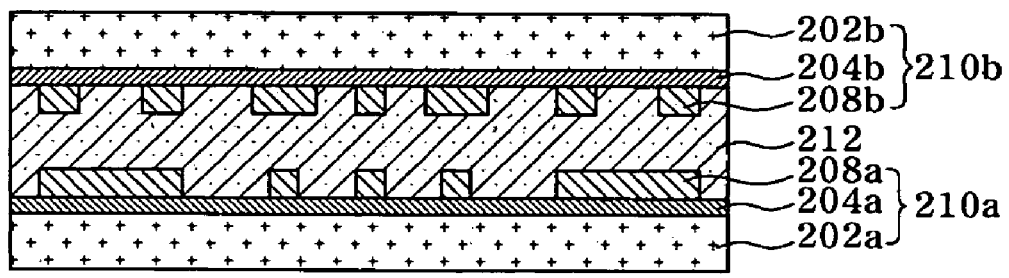
Figure 2F:
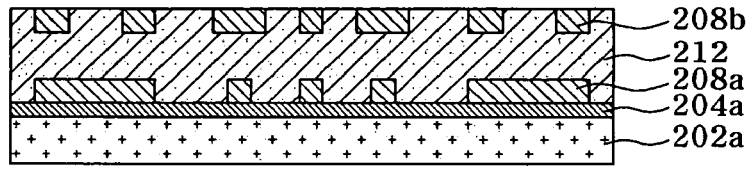
Figure 2G:
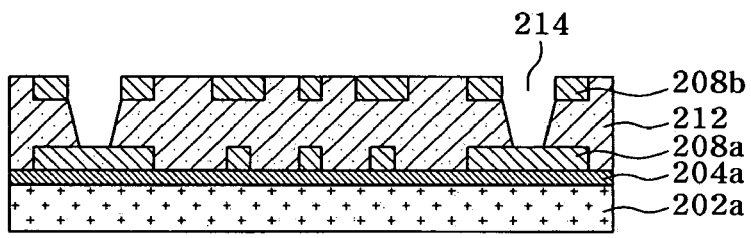
Figure 2H:
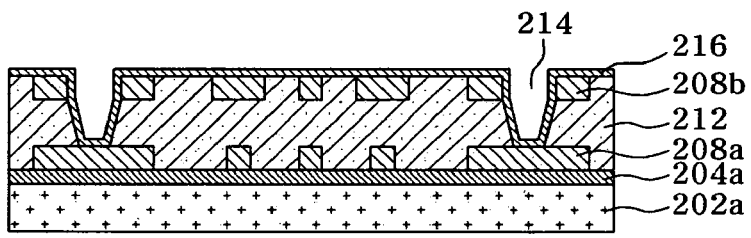
Figure 2I:
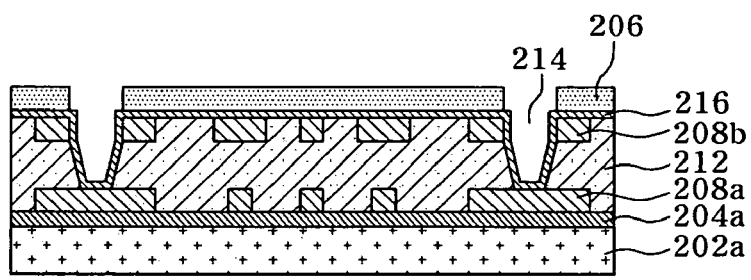
Figure 2J:
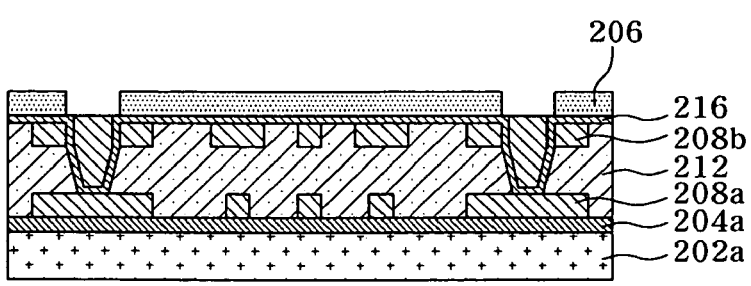
Figure 2K:
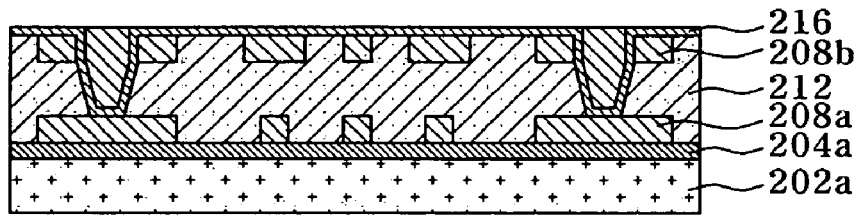
Figure 2L:
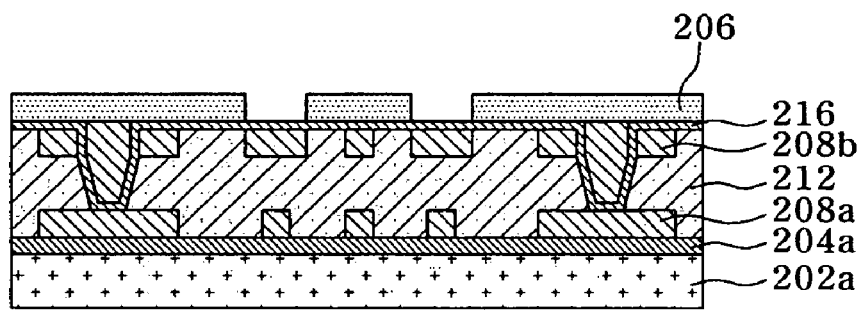
Figure 2M:
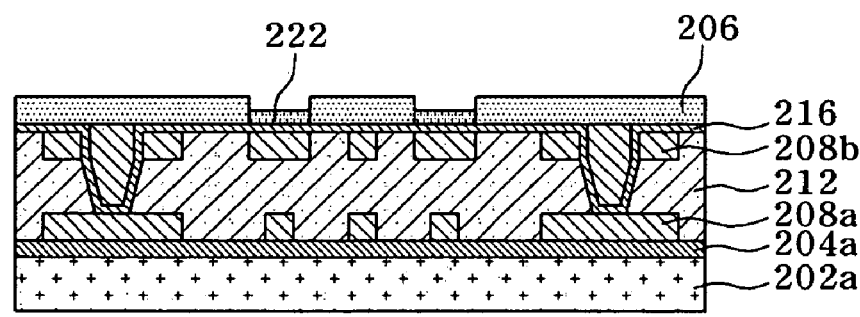
Figure 2N:
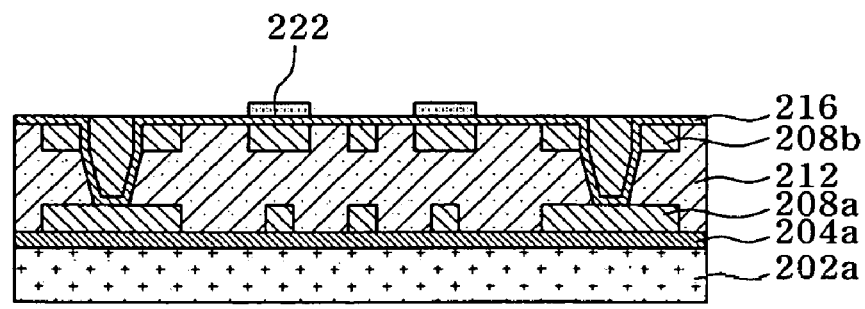
Figure 2O:
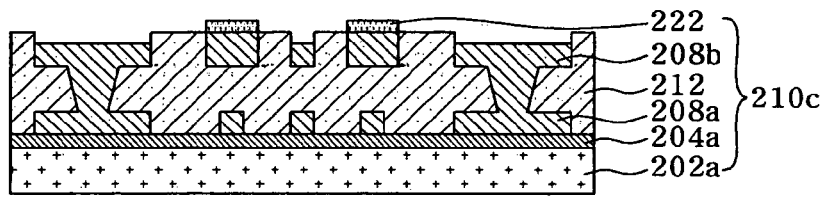
Figure 2P:
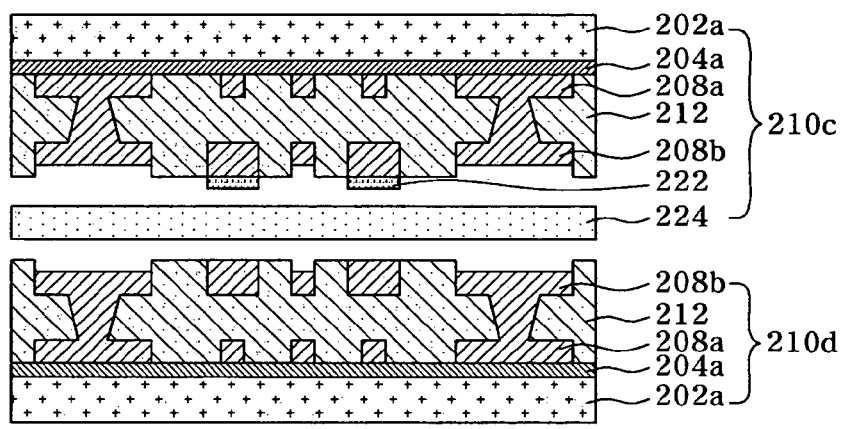
Figure 2Q:
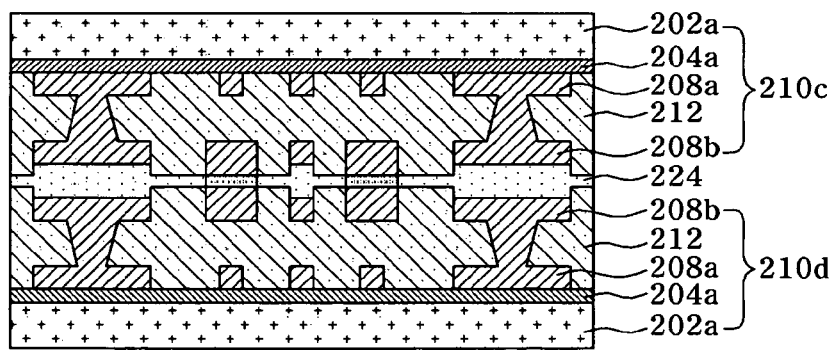
Figure 2R:
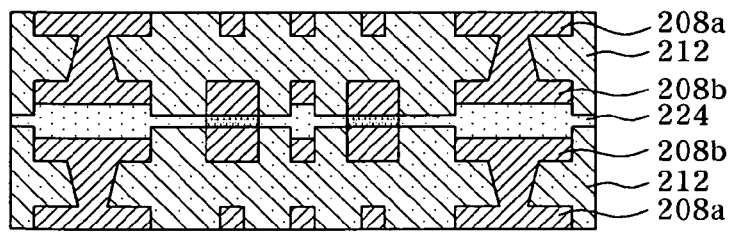
Figure 2S:
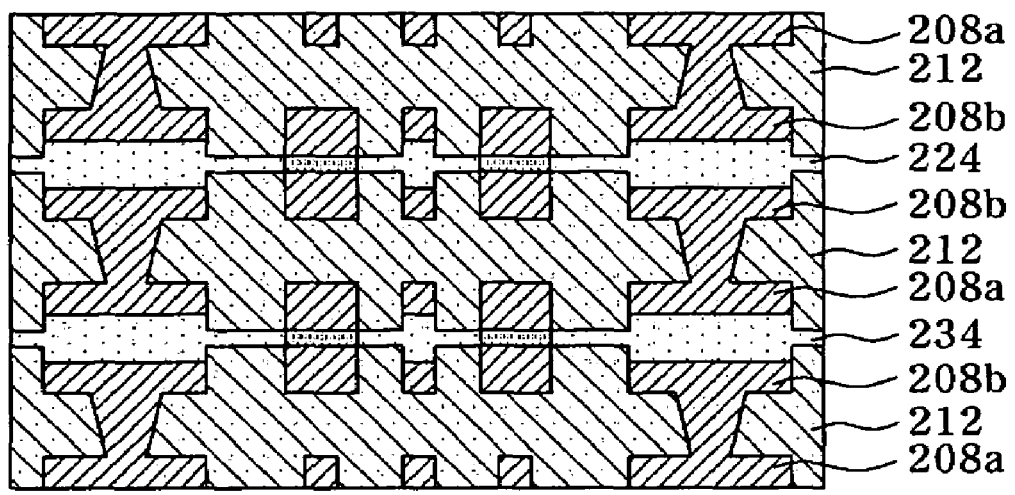
Figure 2T:
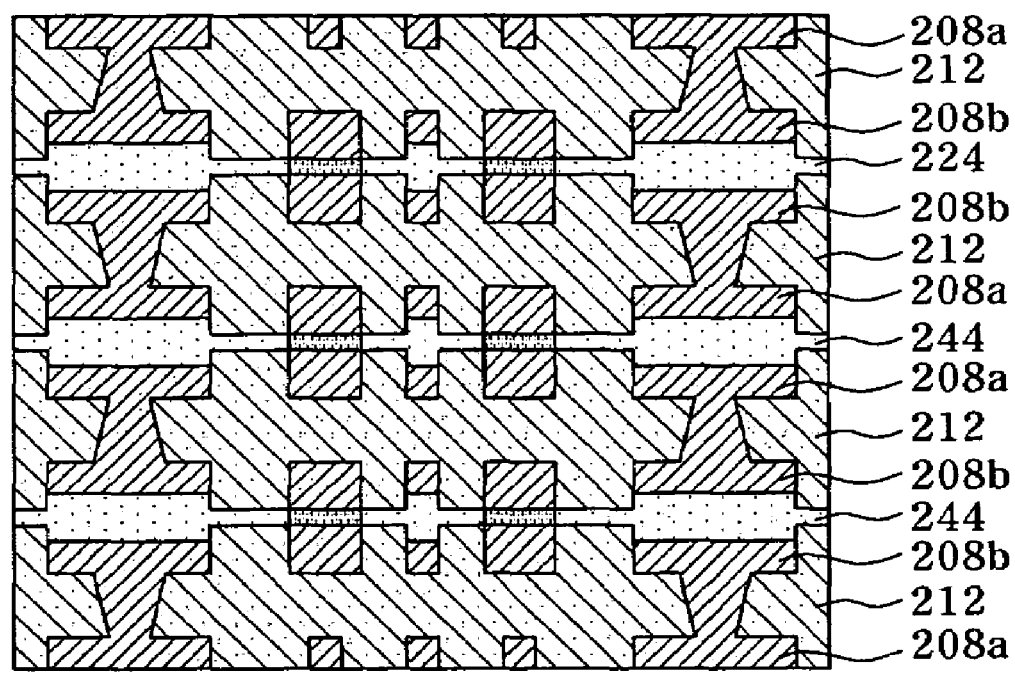

Turning now to FIGS. 2A to 2T, there is illustrated the process of fabricating a multilayer PCB according to a second embodiment of the present invention.

As shown in FIG. 2A, a first metal plating layer 204a is formed on a first metal carrier 202a having a very low CTE.

The first metal carrier 202a includes a metal having a low CTE, for example, SUS304, Invar, or Kovar, in order to protect the substrate from deformation, including extension or warping, due to changes in atmospheric temperature or differences in process temperatures.

The first metal plating layer 204a is formed on the first metal carrier 202a through electroplating.

The first metal plating layer 204a is a plating layer that is able to be removed through flash etching in a subsequent procedure, like an electroless copper plating layer or a copper electroplating layer, and may be formed of a conductive material, such as a copper foil, instead of a metal for electroplating.

After the formation of the first metal plating layer 204a, a photosensitive material 206 is applied on the first metal plating layer 204a.

As the photosensitive material 206, useful is either a liquid photosensitive material, such as a photoresist, or a solder resist. For the formation of a micro circuit pattern, the use of a photoresist is preferable.

After the application of the photosensitive material 206 on the first metal plating layer 204a, the portion of the photosensitive material 206 corresponding to a circuit pattern is removed through exposure and development, and then, as shown in FIG. 2B, a first circuit pattern 208a, which is a lower circuit, is formed through copper electroplating.

Next, as shown in FIG. 2C, the photosensitive material 206 applied on the first metal plating layer 204a is removed. Accordingly, only the first circuit pattern 208a, which is a lower circuit, remains on the first metal plating layer 204a.

After the formation of a first substrate, composed of the first metal carrier 202a, the first metal plating layer 204a, and the first circuit pattern 208a, as shown in FIG. 2D, a second substrate is prepared by forming a second metal plating layer 204b on a second metal carrier 202b and then forming a second circuit pattern, which is an upper circuit, on the second metal plating layer 204b, through the same process as that shown in FIGS. 2A to 2C.

After the formation of the second substrate, a first insulating material 212 is interposed between the second circuit pattern 208b of the second substrate 210b and the first circuit pattern 208a of the first substrate 210a, and then the first substrate 210a, the first insulating material 212 and the second substrate 210b, in that order, are laminated by heat and pressure using a press, as shown in FIG. 2E.

As the first insulating material 212, either a prepreg or polyimide is used.

After the lamination of the first substrate 210a, the first insulating material 212, and the second substrate 210b in that order, as shown in FIG. 2F, the second metal carrier 202b and the second metal plating layer 204b are removed from the second substrate 210b.

The second metal plating layer 204b is removed using an etchant following the removal of the second metal carrier 202b.

After the removal of the second metal carrier 202b and the second metal plating layer 204b from the second substrate 210b, as shown in FIG. 2G, via holes 214 for inner layer connection are formed using a laser in order to expose the upper surface of the first circuit pattern 208a.

Next, as shown in FIG. 2H, an electroless copper plating layer 216 is formed on the second circuit pattern 208b, the inner walls of the via holes 214, and the exposed first circuit pattern 208a, through electroless copper plating.

After the formation of the electroless copper plating layer 216, as shown in FIG. 2I, a photosensitive material 206 is applied on the electroless copper plating layer 216.

As the photosensitive material 206, useful is either a liquid photosensitive material, such as a photoresist, or a solder resist. For the formation of a micro circuit pattern, the use of a photoresist is preferable.

After the application of the photosensitive material 206 on the electroless copper plating layer 216, the photosensitive material 206 applied in the via holes 214 is removed through exposure and development.

Next, as shown in FIG. 2J, the via holes 214 are filled through fill plating using copper electroplating.

That is, the via holes 214 are filled with a copper electroplating layer.

After the filling of the via holes 214, as shown in FIG. 2K, the photosensitive material 206 is removed, and then a photosensitive material 206 is applied on the second circuit pattern 208b of the PCB having the via holes 214 which are filled.

As the photosensitive material 206, useful is either a liquid photosensitive material, such as a photoresist, or a solder resist. For the formation of a micro circuit pattern, the use of a photoresist is preferable.

After the application of the photosensitive material 206 on the second circuit pattern 208b, as shown in FIG. 2L, the portion of the photosensitive material 206 corresponding to a connection plating layer is removed through exposure and development.

Next, as shown in FIG. 2M, a connection plating layer 222 is formed, using any metal suitable for terminal connection plating, including Ag, Sn, or Pb, on the electroless copper plating layer 216 exposed by removing the portion of the photosensitive material corresponding to a connection plating layer.

After the formation of the connection plating layer 222, as shown in FIG. 2N, the photosensitive material 206 applied on the second circuit pattern 208b is removed, and then, as shown in FIG. 2O, the electroless copper plating layer 216 is removed through flash etching.

As such, the connection plating layer 222 functions as a mask for preventing the second circuit pattern 208b, formed therebeneath from being etched.

Accordingly, in the case where the electroless copper plating layer is removed through flash etching, the second circuit pattern 208b, having no connection plating layer 222 thereon, is etched to a predetermined depth by an etchant, and therefore the second circuit pattern 208b, other than the second circuit pattern 208b having the connection plating layer 222 thereon, is lower than the first insulating material 212.

That is, the second circuit pattern 208b, having no connection plating layer 222 thereon, is etched to be lower than the surface of the first insulating material 212.

Herein, because the electroless copper plating layer, formed on the inner walls of the via holes and the second circuit pattern 208b, the second circuit pattern 208b, and the fill plating loaded in the via holes, are formed of a conductive material, they are integrated into the second circuit pattern 208b and are thus simply shown.

In this way, the third substrate 210c, having the connection plating layer 222, is formed, after which, as shown in FIG. 2P, a second insulating material 224 is interposed between the second circuit pattern 208b of a fourth substrate 210d and the connection plating layer 222 of the third substrate 210c, and then, as shown in FIG. 2Q, the third substrate, the second insulating material, and the fourth substrate are laminated by heat and pressure using a press.

Accordingly, the connection plating layer 222 of the third substrate 210c is connected to the second circuit pattern 208b of the fourth substrate 210d.

The fourth substrate 210d is prepared by filling via holes 214 and then removing an electroless copper plating layer 216, formed on the second circuit pattern 208b through flash etching, through the PCB fabrication process shown in FIGS. 2A to 2K.

That is, the fourth substrate 210d is prepared through the PCB fabrication process shown in FIGS. 2A to 2K and FIG. 2O, except for the process shown in FIGS. 2L to 2N for forming the connection plating layer 222.

As the second insulating material 224, either a prepreg or a polyimide is used.

Next, as shown in FIG. 2R, the first metal carrier 202a and the first metal plating layer 204a are removed from the third substrate 210c and the fourth substrate 210d. The first metal plating layer 204a is removed using an etchant following the removal of the first metal carrier 202a.

After the formation of the PCB having four layers, a fifth substrate, which is a PCB having four layers fabricated through the process shown in FIGS. 2A to 2R, and a third substrate, which is a PCB having two layers fabricated through the process shown in FIGS. 2A to 2O, are prepared, and then a third insulating material 234 is interposed between the PCB having four layers and the PCB having two layers, and is then laminated therewith, thus fabricating a PCB having six layers, as shown in FIG. 2S.

In addition, after the formation of the PCB having four layers, two fifth substrates, which are a PCB having four layers formed through the process shown in FIGS. 2A to 2R, are prepared, and then a fourth insulating material 244 is interposed between the two fifth substrates and is then laminated therewith, thus fabricating a PCB having eight layers, as shown in FIG. 2T.

In this way, through the method of fabricating the multilayer PCB according to the second embodiment of the present invention, PCBs having four, six, or eight layers may be fabricated. Alternatively, using the process of fabricating the multilayer PCB shown in FIGS. 2A to 2T, PCBs having odd numbers of layers, for example, three, five, or seven layers, may be fabricated, and as well, PCBs having eight or more layers may be fabricated.

In the method of fabricating the multilayer PCB according to the second embodiment of the present invention, the first metal carrier 202a, having a low CTE, such as SUS304, Invar, or Kovar, is used, in order to protect the substrate from deformation, including extension or warping, due to changes in atmospheric temperature or differences in process temperatures, and thus the PCB may be stably fabricated regardless of the changes in temperature or humidity.

Further, in the method of fabricating the multilayer PCB according to the second embodiment of the present invention, the multilayer circuit pattern is formed so as to be embedded in the insulating material, and then the first metal carrier 202a and the first metal plating layer 204a are removed, thus fabricating the PCB. Thereby, it is possible to fabricate a high-density PCB having a flat surface.

Furthermore, in the method of fabricating the multilayer PCB according to the second embodiment of the present invention, the circuit pattern is inserted into the insulating layer, thus decreasing the thickness of the PCB, and furthermore, the photosensitive material 206 is applied on the portion of the first metal plating layer 204a other than the portion of the first metal plating layer 204a corresponding to the circuit pattern, and subsequently the circuit pattern is formed through copper electroplating, thus realizing a micro circuit.

As described hereinbefore, the present invention provides a method of fabricating a multilayer PCB. According to the present invention, a circuit pattern is inserted into an insulating layer, thus decreasing the thickness of the PCB, and also, a photosensitive material is applied on the portion of a metal plating layer other than the portion of the metal plating layer corresponding to the circuit pattern, and then the circuit pattern is formed through copper electroplating, thus making it possible to realize a micro circuit.

Further, according to the present invention, in order to protect the substrate from deformation, including extension or warping, due to changes in atmospheric temperature or differences in process temperatures, a metal carrier having a low CTE, such as SUS304, Invar, or Kovar, is used, thus stably fabricating the PCB regardless of such changes in temperature or humidity.

Furthermore, according to the present invention, the multilayer circuit pattern is formed to be embedded in the insulating layer and then the metal carrier and the metal plating layer are removed to thus fabricate the PCB, and thereby a high-density PCB having a flat surface can be fabricated.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a multilayer printed circuit board, comprising:
   a) forming a first metal plating layer on a first metal carrier, and then forming a first circuit pattern on the first metal plating layer, thus preparing a first substrate;
   b) forming a second metal plating layer on a second metal carrier, and then forming a second circuit pattern on the second metal plating layer, thus preparing a second substrate;
   c) interposing a first insulating material between the first circuit pattern of the first substrate and the second circuit pattern of the second substrate, laminating the first substrate, the first insulating material and the second substrate, and then removing the second metal carrier and the second metal plating layer from the second substrate;
   d) forming a via hole to expose an upper surface of the first circuit pattern;
   e) forming an electroless copper plating layer on an inner wall of the via hole, the first circuit pattern, and the second circuit pattern, and then filling the via hole;
   f) applying a photosensitive material on the electroless copper plating layer, and then removing a portion of the photosensitive material corresponding to a connection plating layer;
   g) sequentially forming a copper electroplating layer and a connection plating layer on the electroless copper plating exposed by removing the portion of the photosensitive material, and then removing the electroless plating layer;

h) interposing a second insulating material between a connection plating layer of a third substrate formed through the a) to the g) and a second circuit pattern of a fourth substrate formed through the a) to the e), and then laminating the third substrate, the second insulating material and the fourth substrate, thus connecting the connection plating layer of the third substrate to the second circuit pattern of the fourth substrate; and i) sequentially removing the first metal carrier and the first metal plating layer from the third substrate and the fourth substrate.

2. The method as set forth in claim 1, wherein each of the a) and the b) comprises:
forming a metal plating layer on a metal carrier;
applying a photosensitive material on the metal plating layer;
removing a portion of the photosensitive material corresponding to either the first circuit pattern or the second circuit pattern through exposure and development; and
forming either the first circuit pattern or the second circuit pattern through copper electroplating on the metal plating layer exposed by removing the portion of the photosensitive material.

3. The method as set forth in claim 2, wherein the metal carrier is any one selected from among SUS304, Invar, and Kovar, having a low coefficient of thermal expansion.

4. The method as set forth in claim 2, wherein the metal plating layer comprises a plating layer which is able to be subsequently removed through flash etching.

5. The method as set forth in claim 2, wherein the metal plating layer is a copper foil.

6. The method as set forth in claim 1, wherein the photosensitive material is a photoresist or a solder resist.

7. The method as set forth in claim 1, wherein, in the c) and the i), the metal plating layer is removed using an etchant after the metal carrier is removed.

8. The method as set forth in claim 1, wherein the connection plating layer comprises any one metal selected from among Ag, Sn, and Pb.

9. The method as set forth in claim 1, wherein the method comprises:
preparing a fifth substrate having four layers through the a) to the i), preparing a fourth substrate having two layers through the a) to the e), forming a copper electroplating layer and a connection plating layer on a portion of a second circuit pattern of the fourth substrate, interposing an insulating material between a first circuit pattern of the fifth substrate and the connection plating layer of the fourth substrate, laminating the fourth substrate, the insulating material and the fifth substrate, and then removing a first metal carrier and a first metal plating layer from the fourth substrate and the fifth substrate, thereby fabricating a multilayer printed circuit board having six layers.

10. The method as set forth in claim 1, wherein the method comprises:
preparing a fifth substrate having four layers through the a) to the i), preparing a sixth substrate having four layers through the a) to the i), forming a copper electroplating layer and a connection plating layer on a portion of a first circuit pattern of the fifth substrate, interposing an insulating material between the first circuit pattern of the fifth substrate and a connection plating layer of the sixth substrate, laminating the fifth substrate, the insulating material, and the sixth substrate, and then removing a first metal carrier and a first metal plating layer from the fifth substrate and the sixth substrate, thereby fabricating a multilayer printed circuit board having eight layers.

11. A method of fabricating a multilayer printed circuit board, comprising:
a) forming a first metal plating layer on a first metal carrier, and then forming a first circuit pattern on the first metal plating layer, thus preparing a first substrate;
b) forming a second metal plating layer on a second metal carrier, and then forming a second circuit pattern on the second metal plating layer, thus preparing a second substrate;
c) interposing a first insulating material between the first circuit pattern of the first substrate and the second circuit pattern of the second substrate, and then laminating the first substrate, the first insulating material, and the second substrate;
d) removing the second metal carrier and the second metal plating layer from the second substrate, and then forming a via hole to expose an upper surface of the first circuit pattern;
e) forming an electroless copper plating layer on an inner wall of the via hole, the first circuit pattern, and the second circuit pattern, and then filling the via hole;
f) applying a photosensitive material on a portion of the electroless copper plating layer other than a portion of the electroless copper plating layer corresponding to a connection plating layer, and then forming the connection plating layer on the electroless copper plating layer;
g) removing the electroless copper plating layer, which is formed on the second circuit pattern and the first insulating material, using an etchant and using the connection plating layer as a mask, and then etching the electroless copper plating layer having no connection plating layer thereon so that the electroless copper plating layer is lower than a surface of the first insulating material;
h) interposing a second insulating material between a connection plating layer of a third substrate formed through the a) to the g) and a second circuit pattern of a fourth substrate formed through the a) to the e) and then through etching so that a portion of the electroless copper plating layer, other than a portion of the electroless copper plating layer which is to be connected to the connection plating layer, is etched to be lower than the surface of the first insulating material using a photoresist as a mask instead of the connection plating layer in the g), and then laminating the third substrate, the second insulating material, and the fourth substrate, thus connecting the connection plating layer of the third substrate to the second circuit pattern of the fourth substrate; and
i) sequentially removing a first metal carrier and a first metal plating layer from the third substrate and the fourth substrate.

12. The method as set forth in claim 11, wherein each of the a) and the b) comprises:
forming a metal plating layer on a metal carrier;
applying a photosensitive material on the metal plating layer;
removing a portion of the photosensitive material corresponding to either the first circuit pattern or the second circuit pattern through exposure and development; and forming either the first circuit pattern or the second circuit pattern through copper electroplating on the metal plating layer exposed by removing the portion of the photosensitive material.

13. The method as set forth in claim 12, wherein the metal carrier is any one selected from among SUS304, Invar, and Kovar, having a low coefficient of thermal expansion.

14. The method as set forth in claim 12, wherein the metal plating layer comprises a plating layer which is able to be subsequently removed through flash etching.

15. The method as set forth in claim 12, wherein the metal plating layer is formed of a conductive material.

16. The method as set forth in claim 11, wherein the photosensitive material is a photoresist or a solder resist.

17. The method as set forth in claim 11, wherein, in the d) and the i), the metal plating layer is removed using an etchant after the metal carrier is removed.

18. The method as set forth in claim 11, wherein the connection plating layer comprises any one selected from among Ag, Sn, and Pb as a metal for terminal connection.

19. The method as set forth in claim 11, wherein, when the third substrate and the fourth substrate, formed by etching the electroless copper plating layer having no connection plating layer thereon and the electroless copper plating layer having no photoresist thereon so that the electroless copper plating layer is lower than the surface of the first insulating material using the connection plating layer and the photoresist as a mask in the g) or the h), are laminated, a space defined by etched portions of the third substrate and the fourth substrate is filled with the second insulating material to thus form an insulating layer between the third substrate and the fourth substrate.

20. The method as set forth in claim 11, wherein the method comprises:

preparing a fifth substrate having four layers through the a) to the i), subjecting the fifth substrate to etching so that a portion of a circuit pattern of the fifth substrate other than a portion of the circuit pattern which is to be connected to the connection plating layer is etched to be lower than the surface of the first insulating material using a photoresist instead of the connection plating layer as a mask, preparing a third substrate having two layers through the a) to the g), interposing a third insulating material between the fifth substrate and the third substrate, laminating the third substrate, the third insulating material and the fifth substrate to thus connect the connection plating layer of the third substrate to the circuit pattern of the fifth substrate, and then sequentially removing a first metal carrier and a first metal plating layer from the third substrate, thereby fabricating a multilayer printed circuit board having six layers.

21. The method as set forth in claim 11, wherein the methods comprises:

sequentially subjecting two fifth substrates, each having four layers, to the h) and the i), thereby fabricating a multilayer printed circuit board having eight layers, or sequentially subjecting a sixth substrate having six layers and a fifth substrate having four layers to the h) and the i), thereby a multilayer printed circuit board having ten layers.

* * * * *